United States Patent
Komiyama et al.

(10) Patent No.: US 12,446,201 B2
(45) Date of Patent: Oct. 14, 2025

(54) ELECTROMAGNETIC WAVE NOISE SUPPRESSION SHEET AND METHOD FOR MANUFACTURING THE SAME

(71) Applicant: HOKUETSU CORPORATION, Nagaoka (JP)

(72) Inventors: Hideaki Komiyama, Nagaoka (JP); Atsushi Tamura, Nagaoka (JP)

(73) Assignee: HOKUETSU CORPORATION, Nagaoka (JP)

( * ) Notice: Subject to any disclaimer, the term of this patent is extended or adjusted under 35 U.S.C. 154(b) by 0 days.

(21) Appl. No.: 18/275,376

(22) PCT Filed: Mar. 19, 2021

(86) PCT No.: PCT/JP2021/011477
§ 371 (c)(1),
(2) Date: Aug. 1, 2023

(87) PCT Pub. No.: WO2022/195871
PCT Pub. Date: Sep. 22, 2022

(65) Prior Publication Data
US 2024/0107733 A1    Mar. 28, 2024

(51) Int. Cl.
*H05K 9/00* (2006.01)
*C08J 5/18* (2006.01)
(Continued)

(52) U.S. Cl.
CPC .............. *H05K 9/009* (2013.01); *C08J 5/18* (2013.01); *C08J 7/0427* (2020.01); *C08K 3/041* (2017.05);
(Continued)

(58) Field of Classification Search
CPC ...................................................... H05K 9/009
See application file for complete search history.

(56) References Cited

U.S. PATENT DOCUMENTS

2001/0028791 A1 * 10/2001 Salyer ................... F24H 7/0433
165/902
2004/0024039 A1 * 2/2004 Tasaka ................. C07D 403/06
514/397
(Continued)

FOREIGN PATENT DOCUMENTS

| CN | 101353547 A | 1/2009 |
| CN | 108034345 A | 5/2018 |

(Continued)

OTHER PUBLICATIONS

Mar. 9, 2022 Office Action issued in Taiwanese Patent Application No. 110111766.
(Continued)

*Primary Examiner* — William D Young
(74) *Attorney, Agent, or Firm* — Oliff PLC

(57) ABSTRACT

An electromagnetic wave noise suppression sheet having high electromagnetic wave noise suppression performance and thermal conductivity and reducing cost includes a first layer containing carbon nanotubes, an inorganic filler, and carboxymethylcellulose. The inorganic filler is at least one selected from the group consisting of graphite, carbon black, and an inorganic pigment. A ratio of a mass of the inorganic filler to a mass of the carbon nanotubes is ¼ or more and 2 or less.

20 Claims, 12 Drawing Sheets

(51) Int. Cl.
*C08J 7/04* (2020.01)
*C08K 3/04* (2006.01)
*C08K 3/34* (2006.01)

(52) U.S. Cl.
CPC .............. *C08K 3/042* (2017.05); *C08K 3/346* (2013.01); *C08J 2301/28* (2013.01)

(56) References Cited

U.S. PATENT DOCUMENTS

| | | | |
|---|---|---|---|
| 2009/0023832 A1* | 1/2009 | Maeda ................... | C09J 133/14 522/100 |
| 2010/0095911 A1 | 4/2010 | Morita et al. | |
| 2011/0039124 A1 | 2/2011 | Ikeuchi et al. | |
| 2012/0058889 A1 | 3/2012 | Nishino et al. | |
| 2013/0130049 A1 | 5/2013 | Moilanen et al. | |
| 2013/0209791 A1 | 8/2013 | Oi et al. | |
| 2014/0202745 A1* | 7/2014 | Kobayashi ........... | H05K 9/0083 252/511 |
| 2014/0228475 A1* | 8/2014 | Asmus ................... | A61L 24/06 523/118 |
| 2016/0211504 A1* | 7/2016 | Uezono ............... | H01M 4/0409 |
| 2016/0268017 A1 | 9/2016 | Kitamura et al. | |
| 2017/0062831 A1 | 3/2017 | Predtechenskiy et al. | |
| 2018/0002179 A1 | 1/2018 | Okamoto et al. | |
| 2019/0347234 A1 | 11/2019 | Yamaguchi | |
| 2020/0002172 A1 | 1/2020 | Shigeta | |
| 2020/0061563 A1 | 2/2020 | Nakano | |
| 2020/0267877 A1 | 8/2020 | Hiroi et al. | |

FOREIGN PATENT DOCUMENTS

| | | |
|---|---|---|
| CN | 110591579 A | 12/2019 |
| CN | 111763459 A | 10/2020 |
| CN | 112105248 A | 12/2020 |
| EP | 4132248 A1 | 2/2023 |
| JP | 2008-189901 A | 8/2008 |
| JP | 2012-174833 A | 9/2012 |
| JP | 2013-082610 A | 5/2013 |
| JP | 2013-199419 A | 10/2013 |
| JP | 6585250 B1 | 10/2019 |
| JP | 2019-198197 A | 11/2019 |
| JP | 2020-011905 A | 1/2020 |
| JP | 2020-127039 A | 8/2020 |
| JP | 2021-118299 A | 8/2021 |
| KR | 100874690 B1 | 12/2008 |
| TW | 200949864 A | 12/2009 |
| TW | 201038472 A | 11/2010 |
| TW | 201604899 A | 2/2016 |
| WO | 2011/076979 A1 | 6/2011 |
| WO | 2015/064708 A1 | 5/2015 |
| WO | 2016/136428 A1 | 9/2016 |
| WO | 2018/180350 A1 | 10/2018 |
| WO | 2020/195974 A1 | 10/2020 |

OTHER PUBLICATIONS

Aug. 4, 2022 Office Action issued in Taiwanese Patent Application No. 110111766.
Jun. 8, 2021 International Search Report issued in International Patent Application No. PCT/JP2021/011477.
Jan. 4, 2022 Office Action issued in Taiwanese Patent Application No. 110111776.
May 13, 2022 Office Action issued in Taiwanese Patent Application No. 110111776.
Jun. 8, 2021 International Search Report issued in International Patent Application No. PCT/JP2021/011466.
U.S. Appl. No. 18/275,385, filed Aug. 1, 2023 in the name of Hideaki Komiyama et al.
Sep. 3, 2024 Office Action issued in Japanese Patent Application No. 2023-506682.
Sep. 3, 2024 Office Action issued in Japanese Patent Application No. 2023-506686.
Feb. 24, 2025 Office Action issued in Korean Patent Application No. 10-2023-7033732.
Feb. 24, 2025 Office Action issued in Korean Patent Application No. 10-2023-7033733.
Nov. 28, 2024 Search Report issued in European Patent Application No. 21931613.0.
Dec. 3, 2024 Search Report issued in European Patent Application No. 21931617.1.
Dec. 3, 2024 Office Action issued in Japanese Patent Application No. 2023-506682.
Dec. 3, 2024 Office Action issued in Japanese Patent Application No. 2023-506686.
May 20, 2025 Office Action issued in U.S. Appl. No. 18/275,385.
Apr. 30, 2025 Office Action issued in Japanese Application No. 2023-506686.
Jul. 25, 2025 Office Action issued in U.S. Appl. No. 18/275,385.

* cited by examiner

| INORGANIC FILLER | CNT : INORGANIC FILLER | THICKNESS [μm] | SURFACE RESISTIVITY [Ω/□] | Rtp [dB] @6GHz | Rtp [dB] @15GHz | THERMAL CONDUCTIVITY [W/m·K] |
|---|---|---|---|---|---|---|
| ASAHI THERMAL (CARBON BLACK) | 4:1 | 3.6 | 56 | 32.1 | 39.2 | 1.12 |
| | 1:1 | 3.6 | 102 | 20.7 | 32.0 | 1.19 |
| | 1:2 | 3.7 | 218 | 14.8 | 25.2 | 1.29 |
| | 1:4 | 3.4 | 665 | 8.4 | 14.4 | 1.24 |
| SB 720 (CARBON BLACK) | 4:1 | 3.8 | 45 | 41.3 | 45.4 | 1.21 |
| | 1:1 | 3.3 | 99 | 35.2 | 50.9 | 1.14 |
| | 1:2 | 3.5 | 110 | 28.7 | 46.5 | 1.21 |
| | 1:4 | 3.7 | 289 | 24.1 | 40.6 | 1.11 |
| J-CPB (GRAPHITE) | 4:1 | 3.6 | 48 | 37.7 | 38.2 | 1.27 |
| | 1:1 | 3.6 | 76 | 35.8 | 48.4 | 1.69 |
| | 1:2 | 3.7 | 160 | 24.2 | 40.6 | 2.78 |
| | 1:4 | 3.6 | 326 | 17.8 | 35.7 | 2.15 |

FIG. 6

| INORGANIC FILLER | CNT : INORGANIC FILLER | THICKNESS [μm] | SURFACE RESISTIVITY [Ω/□] | Rtp [dB] | | THERMAL CONDUCTIVITY [W/m·K] |
|---|---|---|---|---|---|---|
| | | | | @6GHz | @15GHz | |
| HYDRAGLOSS 90 (KAOLIN) | 4:1 | 3.7 | 43 | 37.4 | 40.6 | 1.15 |
| | 1:1 | 3.7 | 77 | 32.3 | 45.4 | 1.23 |
| | 1:2 | 3.5 | 187 | 33.3 | 47.3 | 1.38 |
| | 1:4 | 3.9 | 571 | 12.7 | 22.7 | 1.30 |
| TAMA PEARL TP 121 (LIGHT CAL) | 4:1 | 3.5 | 49 | 22.9 | 31.3 | 1.45 |
| | 1:1 | 3.8 | 83 | 29.4 | 45.5 | 1.34 |
| | 1:2 | 3.5 | 195 | 33.4 | 47.6 | 1.37 |
| | 1:4 | 3.6 | 652 | 9.5 | 17.9 | 1.49 |
| SOFTON 1500 (HEAVY CAL) | 4:1 | 3.8 | 52 | 28.4 | 33.9 | 1.24 |
| | 1:1 | 3.7 | 90 | 23.5 | 35.0 | 1.30 |
| | 1:2 | 3.3 | 229 | 33.8 | 45.4 | 1.27 |
| | 1:4 | 3.6 | 819 | 8.6 | 18.3 | 1.10 |

FIG. 11

ELECTROMAGNETIC WAVE NOISE SUPPRESSION SHEET AND METHOD FOR MANUFACTURING THE SAME

TECHNICAL FIELD

The present invention relates to an electromagnetic wave noise suppression sheet and a method for manufacturing the same.

BACKGROUND ART

A carbon nanotube has a structure in which a uniform planar graphene sheet is rolled in a cylindrical shape. Since the carbon nanotube has such a unique structure, it has various properties, and is expected to be applied in a wide range of fields.

For example, PTL 1 describes an electromagnetic wave suppression sheet applied to a substrate so that 1 g/cm² or more of multi-walled carbon nanotubes exists on the substrate.

CITATION LIST

Patent Literature

PTL 1: JP-A-2012-174833

SUMMARY OF INVENTION

Technical Problem

The electromagnetic wave suppression sheet as described above is used by being attached to, for example, an electronic device. The electronic device easily accumulates heat. Therefore, high thermal conductivity as well as electromagnetic wave noise suppression performance is required. In a case where the thermal conductivity is high, heat of the electronic device can be dissipated efficiently.

Furthermore, the carbon nanotubes as described above are expensive. Therefore, if the carbon nanotubes can partially be replaced with another inorganic material while ensuring the electromagnetic wave noise suppression performance, cost reduction can be achieved.

One object according to some aspects of the present invention is to provide an electromagnetic wave noise suppression sheet having high electromagnetic wave noise suppression performance and thermal conductivity and reducing cost. Another object according to some aspects of the present invention is to provide a method for manufacturing an electromagnetic wave noise suppression sheet having high electromagnetic wave noise suppression performance and thermal conductivity and reducing cost.

Solution to Problem

One aspect of an electromagnetic wave noise suppression sheet according to the present invention includes
  a first layer containing carbon nanotubes, an inorganic filler, and sodium carboxymethylcellulose, where
    the inorganic filler is at least one selected from the group consisting of graphite, carbon black, and an inorganic pigment, and
  a ratio of a mass of the inorganic filler to a mass of the carbon nanotubes is ¼ or more and 2 or less.

In one aspect of the electromagnetic wave noise suppression sheet,
  the inorganic filler may be the graphite.
In one aspect of the electromagnetic wave noise suppression sheet,
  the inorganic filler may be the inorganic pigment.
In one aspect of the electromagnetic wave noise suppression sheet,
  the inorganic pigment may be kaolin.
In any one of the aspects of the electromagnetic wave noise suppression sheet, the ratio may be 1 or less.
In any one of the aspects of the electromagnetic wave noise suppression sheet,
  the ratio may be 1 or more.
Any one of the aspects of the electromagnetic wave noise suppression sheet may include
  a second layer provided with the first layer.
One aspect of a method for manufacturing an electromagnetic wave noise suppression sheet includes
  a process of preparing a dispersion liquid containing carbon nanotubes, an inorganic filler, sodium carboxymethylcellulose and water, and
  a process of forming a first layer by drying the dispersion liquid, where the inorganic filler is at least one selected from the group consisting of graphite, carbon black, and an inorganic pigment, and,
  in the dispersion liquid, a ratio of a mass of the inorganic filler to a mass of the carbon nanotubes is ¼ or more and 2 or less.
In one aspect of the method for manufacturing an electromagnetic wave noise suppression sheet,
  the inorganic filler may be the graphite.
In one aspect of the method for manufacturing an electromagnetic wave noise suppression sheet,
  the inorganic filler may be the inorganic pigment.
In one aspect of the method for manufacturing an electromagnetic wave noise suppression sheet,
  the inorganic pigment may be kaolin.
Any one of the aspects of the method for manufacturing an electromagnetic wave noise suppression sheet may include
  a process of applying the dispersion liquid to a second layer before the process of forming the first layer.

An electromagnetic wave noise suppression sheet according to the present invention includes a first layer containing carbon nanotubes, an inorganic filler, and sodium carboxymethylcellulose. The inorganic filler is at least one selected from the group consisting of graphite, carbon black, and an inorganic pigment. A ratio of a mass of the inorganic filler to a mass of the carbon nanotubes is ¼ or more and 2 or less. Therefore, the electromagnetic wave noise suppression performance and the thermal conductivity are high, and the cost is low.

BRIEF DESCRIPTION OF DRAWINGS

FIG. 6 is a table illustrating a transmission attenuation power ratio of applied paper in a case where carbon black or graphite is used as an inorganic filler.

FIG. 11 is a table illustrating a transmission attenuation power ratio of applied paper in a case where an inorganic pigment is used as an inorganic filler.

DESCRIPTION OF EMBODIMENTS

Hereinbelow, preferred embodiments of the present invention will be described in detail with reference to the drawings. Note that the embodiments described below do not unreasonably limit the contents of the present invention described in the claims. In addition, not all the components described below are essential components of the present invention.

1. ELECTROMAGNETIC WAVE NOISE SUPPRESSION SHEET

1.1. Overall Configuration

Figure 1:
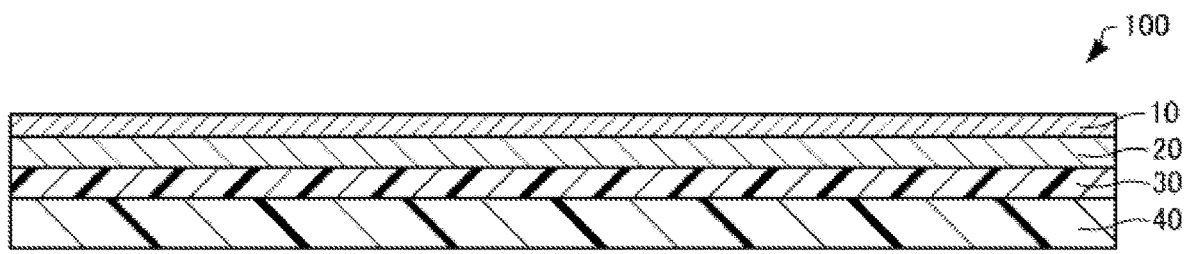
FIG. 1 is a cross-sectional view schematically illustrating an electromagnetic wave noise suppression sheet according to the present embodiment.

First, an electromagnetic wave noise suppression sheet according to the present embodiment will be described with reference to the drawings. FIG. 1 is a cross-sectional view schematically illustrating an electromagnetic wave noise suppression sheet 100 according to the present embodiment.

The electromagnetic wave noise suppression sheet 100 is formed in a sheet shape in which the length in the in-plane direction (direction orthogonal to the thickness direction) is sufficiently long with respect to the thickness direction. The planar shape of the electromagnetic wave noise suppression sheet 100 is not particularly limited, but is, for example, rectangular.

As illustrated in FIG. 1, the electromagnetic wave noise suppression sheet 100 includes, for example, an applied layer 10 as a first layer, a support layer 20 as a second layer, an adhesive layer 30, and a releasable layer 40. Hereinbelow, the respective members will be described in order.

1.1.1. Applied Layer

1.1.1.1. Physical Properties and the Like

The applied layer 10 is provided on the support layer 20. The applied layer 10 is a layer applied to the support layer 20.

The surface resistivity of the applied layer 10 is, for example, 400Ω/□ or less, preferably 300Ω/□ or less, and more preferably 200Ω/□ or less. In a case where the surface resistivity of the applied layer 10 is 400Ω/□ or less, the electromagnetic wave noise suppression performance can be enhanced. The surface resistivity of the applied layer 10 can be measured in accordance with "JIS K 7194".

The thickness of the applied layer 10 is, for example, 1.0 μm or more and 300 μm or less, preferably 2.0 μm or more and 250 μm or less, and more preferably 3.0 μm or more and 200 μm or less. In a case where the thickness of the applied layer 10 is 1.0 μm or more, the surface resistivity of the applied layer 10 can be reduced. In a case where the thickness of the applied layer 10 is 300 μm or less, the possibility of occurrence of cracks in the applied layer 10 can be reduced. The thickness of the applied layer 10 can be measured by a scanning electron microscope (SEM).

The thermal conductivity of the applied layer 10 in the in-plane direction is, for example, 1.10 W/m·K or more, preferably 1.20 W/m·K or more, and more preferably 1.50 W/m·K or more. The "thermal conductivity of the applied layer 10 in the in-plane direction" is thermal conductivity in a direction orthogonal to the thickness direction of the applied layer 10 (stacking direction of the applied layer 10 and the support layer 20). Hereinbelow, the "thermal conductivity of the applied layer 10 in the in-plane direction" is also referred to simply as the "thermal conductivity of the applied layer 10". In a case where the thermal conductivity of the applied layer 10 is 1.10 W/m·K or more, the thermal conductivity of the electromagnetic wave noise suppression sheet 100 can be enhanced. The thermal conductivity λ can be calculated by the following formula (1), where a represents thermal diffusivity, C represents specific heat, and p represents density.

$$\lambda = \alpha \times C \times \rho \tag{1}$$

1.1.1.2. Materials

The applied layer 10 contains carbon nanotubes (hereinbelow, also referred to as "CNTs"), an inorganic filler, and sodium carboxymethylcellulose (hereinbelow, also referred to as "CMC"). The applied layer 10 may contain only the CNTs, the inorganic filler, and the CMC. Hereinbelow, the respective materials will be described in order.

(1) Carbon Nanotube (CNT)

The CNT contained in the applied layer 10 is a single-walled carbon nanotube (SWCNT), in which a single six-membered ring network (graphene sheet) made of carbon is rolled in a cylindrical shape, and/or a multi-walled carbon nanotube (MWCNT), in which a plurality of graphene sheets are concentrically rolled. The applied layer 10 may contain only one of either the SWCNT or the MWCNT or may contain both the SWCNT and the MWCNT, but in consideration of the dispersibility of the CNT, it is preferable to contain only the MWCNT. Both the ends of the CNT may be closed or opened.

The CNT as described above is prepared into a preferred size by, for example, an arc discharge method, a laser ablation method, a chemical vapor deposition (CVD) method, or the like. The CNTs contained in the applied layer 10 may be prepared by any method.

The diameter of the CNT is, for example, 1 nm or more and 100 nm or less, preferably 5 nm or more and 50 nm or less, and more preferably 8 nm or more and 15 nm or less. In a case where the diameter of the CNT is 1 nm or more and 100 nm or less, a dispersion liquid having good dispersibility of the CNTs can be prepared when the applied layer 10 is formed. The diameter of the CNT can be measured by SEM.

The fiber length of the CNT is, for example, 0.5 μm or more and 50 μm or less, and preferably 15 μm or more and 35 μm or less. In a case where the fiber length of the CNT is 0.5 μm or more and 50 μm or less, a dispersion liquid having good dispersibility of the CNTs can be prepared. The fiber length of the CNT can be measured by SEM. Note that the "fiber length of the CNT" is a length of the CNT in a state of being bundled by van der Waals force, and is a length of the CNT before being dispersed in a solvent.

The BET specific surface area of the CNT is, for example, 50 $m^2/g$ or more and 500 $m^2/g$ or less, and preferably 100 $m^2/g$ or more and 300 $m^2/g$ or less. In a case where the BET specific surface area of the CNT is 50 $m^2/g$ or more and 500 $m^2/g$ or less, a dispersion liquid having good dispersibility of the CNTs can be prepared when the applied layer 10 is formed. Note that the "BET specific surface area" is a specific surface area measured by a Brunauer Emmett Teller (BET) method, and can be measured by an automatic specific surface area measurement device.

In the dispersion liquid for forming the applied layer 10, the content of the CNTs is, for example, 0.1 mass % or more and 10.0 mass % or less, preferably 0.5 mass % or more and 5.0 mass % or less, and more preferably 2.0 mass % or more and 4.0 mass % or less. In a case where the content of the CNTs is 0.1 mass % or more, the electromagnetic wave noise suppression performance can be enhanced. In a case where the content of the CNTs is 10.0 mass % or less, a dispersion liquid having good dispersibility of the CNTs can be prepared when the applied layer 10 is formed.

(2) Inorganic Filler

The inorganic filler contained in the applied layer 10 is at least one selected from the group consisting of graphite, carbon black, and an inorganic pigment. The inorganic filler may be one selected from the group, or may contain two or more selected from the group at an arbitrary ratio.

The inorganic filler contained in the applied layer 10 may be graphite. In a case where the inorganic filler is graphite, the thermal conductivity can be increased as compared with the case where the inorganic filler is carbon black or an inorganic pigment. The BET specific surface area of the graphite is not particularly limited, but is preferably 1 $m^2/g$ or more and 100 $m^2/g$ or less, and more preferably 5 $m^2/g$ or more and 20 $m^2/g$ or less.

The inorganic filler contained in the applied layer 10 may be carbon black. A plurality of carbon black particles are connected to constitute a structure. The characteristics of the carbon black are determined mainly by the particle diameter and the length of the structure. The iodine adsorption amount depends on the particle diameter, and the larger the iodine adsorption amount, the shorter the particle diameter. The dibutyl phthalate (DBP) absorption amount depends on the length of the structure, and the larger the DBP absorption amount, the longer the structure.

The iodine adsorption amount in the carbon black contained in the applied layer 10 is, for example, 20 mg/g or more and 160 mg/g or less, and preferably 120 mg/g or more. In a case where the iodine adsorption amount in the carbon black is 120 mg/g or more, the electromagnetic wave noise suppression performance can be enhanced as compared with the case where the iodine adsorption amount is less than 120 mg/g. The DBP absorption amount in the carbon black is, for example, 20 ml/100 g or more and 200 ml/100 g or less, and preferably 50 ml/100 g or more. In a case where the DBP adsorption amount in the carbon black is 50 ml/100 g or more, the electromagnetic wave noise suppression performance can be enhanced as compared with the case where the DBP adsorption amount is less than 50 ml/100 g. The BET specific surface area of the carbon black is, for example, 80 $m^2/g$ or more and 160 $m^2/g$ or less.

The iodine adsorption amount in the carbon black can be determined in accordance with "JIS K 6217-1". The DBP absorption amount in the carbon black can be determined in accordance with "JIS K 6217-4". The BET specific surface area of the carbon black can be determined in accordance with "JIS K 6217-2".

The inorganic filler contained in the applied layer 10 may be an inorganic pigment. The inorganic pigment is a chemically inorganic pigment, and is a pigment produced from an oxide or the like obtained by a chemical reaction of natural ore or metal. In a case where the inorganic filler is an inorganic pigment, the cost can be reduced as compared with the case where the inorganic filler is graphite or carbon black. The inorganic pigment is, for example, kaolin, light calcium carbonate, or heavy calcium carbonate, and is preferably kaolin. In a case where the inorganic pigment is kaolin, the electromagnetic wave noise suppression performance can be enhanced as compared with the case where the inorganic pigment is light calcium carbonate or heavy calcium carbonate.

In the applied layer 10, the ratio $M_F/M_{CNT}$ of the mass $M_F$ of the inorganic filler to the mass $M_{CNT}$ of the CNTs is ¼ or more and 2 or less (CNT:inorganic filler=4:1 to 1:2). In a case where the ratio $M_F/M_{CNT}$ is ¼ or more, the electromagnetic wave noise suppression performance and the thermal conductivity can be enhanced. In a case where the ratio $M_F/M_{CNT}$ is 2 or less, cost reduction can be achieved. The ratio $M_F/M_{CNT}$ can be measured by thermal gravimetric analysis (TGA).

In a case where the inorganic filler contained in the applied layer 10 is graphite, the ratio $M_F/M_{CNT}$ may be 1 or less. In a case where the ratio $M_F/M_{CNT}$ is 1 or less, the electromagnetic wave noise suppression performance can be enhanced for a frequency of 12 GHz or less as compared with the case where the ratio $M_F/M_{CNT}$ is more than 1. In a case where the inorganic filler contained in the applied layer 10 is graphite, the ratio $M_F/M_{CNT}$ may be 1 or more. In a case where the ratio $M_F/M_{CNT}$ is 1 or more, the thermal conductivity can be enhanced as compared with the case where the ratio $M_F/M_{CNT}$ is less than 1. Furthermore, the electromagnetic wave noise suppression performance can be enhanced for a frequency of 14 GHz or more.

In a case where the inorganic filler contained in the applied layer 10 is kaolin, the ratio $M_F/M_{CNT}$ may be 1 or less. In a case where the ratio $M_F/M_{CNT}$ is 1 or less, the electromagnetic wave noise suppression performance can be enhanced for a frequency of 7 GHz or less as compared with the case where the ratio $M_F/M_{CNT}$ is more than 1. In a case where the inorganic filler contained in the applied layer 10 is kaolin, the ratio $M_F/M_{CNT}$ may be 1 or more. In a case where the ratio $M_F/M_{CNT}$ is 1 or more, the thermal conductivity can be enhanced as compared with the case where the ratio $M_F/M_{CNT}$ is less than 1. Furthermore, the electromagnetic wave noise suppression performance can be enhanced for a frequency of 9 GHz or more.

(3) SodiumCarboxymethylcellulose (CMC)

The CMC functions as a dispersant for dispersing the CNTs when the applied layer 10 is formed. As the dispersant for the CNTs, for example, only the CMC is used. The "dispersant" refers to an additive that disperses the CNTs in water to contribute to prevention of aggregation and sedimentation of the CNTs. By using only the CMC as a dispersant for the CNTs, formation of bubbles and the like can be prevented as compared with, for example, a case where an anionic surfactant or the like is added as a dispersant as well as the CMC.

The weight average molecular weight of the CMC is, for example, 5000 or more and 100000 or less, preferably 10000 or more and 60000 or less, and more preferably 10000 or more and 35000 or less. In a case where the weight average molecular weight of the CMC is 5000 or more, the CMC is easily attached to the CNTs, and the dispersibility of the CNTs is improved. However, in a case where the weight average molecular weight is too much, the dispersibility is rather degraded, and therefore the molecular weight of the CMC is preferably 100000 or less. Note that the term "weight average molecular weight" as used herein refers to a weight average molecular weight in terms of polystyrene measured by gel permeation chromatography (GPC).

The degree of etherification of the CMC is, for example, 0.6 or more and 1.2 or less, and preferably 0.6 or more and 0.8 or less. In a case where the degree of etherification of the CMC is 0.6 or more and 1.2 or less, a dispersion liquid having good dispersibility of the CNTs can be prepared.

In the dispersion liquid for forming the applied layer 10, the content of the CMC is, for example, 0.1 mass % or more and 10.0 mass % or less, preferably 0.5 mass % or more and 5.0 mass % or less, and more preferably 2.0 mass % or more and 4.0 mass % or less.

In the applied layer 10, the ratio $M_{CMC}/M_{SUM}$ of the mass $M_{CMC}$ of the CMC to the sum $M_{SUM}$ of the mass of the CNTs and the mass of the inorganic filler is 1/5 or more and 3 or less, and preferably 1/3 or more and 1 or less. In a case where the ratio $M_{CMC}/M_{SUM}$ is 1/5 or more, a dispersion liquid having good dispersibility of the CNTs can be prepared. In a case where the ratio $M_{CMC}/M_{SUM}$ is 3 or less, the electromagnetic wave noise suppression performance can be enhanced. The ratio $M_{CMC}/M_{SUM}$ can be derived by thermal gravimetric analysis.

(4) Additives

The applied layer 10 may contain various additives such as a thickener, a preservative, and a pH adjuster as necessary.

1.1.2. Support Layer

The support layer 20 is provided on the adhesive layer 30. The support layer 20 is provided with the applied layer 10. The support layer 20 supports the applied layer 10.

The support layer 20 is, for example, a sheet containing pulp. The support layer 20 may contain only the pulp. Examples of the pulp contained in the support layer 20 include chemical pulp such as LBKP (leaf bleached kraft pulp) and NBKP (needle bleached kraft pulp), mechanical pulp such as GP (ground pulp), PGW (pressure groundwood), RMP (refiner mechanical pulp), TMP (thermomechanical pulp), CTMP (chemi-thermomechanical pulp), CMP (chemi-mechanical pulp), and CGP (chemi-ground pulp), wood pulp such as DIP (de-inked pulp), and non-wood pulp such as kenaf, bagasse, bamboo and cotton. The support layer 20 may contain only one of these pulp kinds, or may contain two or more thereof at an arbitrary ratio. Further, the support layer 20 may contain synthetic fibers as long as the quality is not impaired.

The support layer 20 preferably contains LBKP. The content of LBKP in the support layer 20 is, for example, 70 mass % or more, preferably 90 mass % or more, and more preferably 100 mass %. In a case where the content of LBKP is 70 mass % or more, warping of the support layer 20 can be reduced.

In a case where the basis weight of the support layer 20 is 40 g/m² or less, the support layer 20 preferably contains NBKP. The content of NBKP in the support layer 20 is, for example, 30 mass % or less. In a case where the content of NBKP is 30 mass % or less, the smoothness and strength of the support layer 20 can be maintained.

The support layer 20 may contain various additives such as a filler, a paper strength enhancer, a sizing agent, a bulking agent, a yield improver, a water-filterability improver, a sulfuric acid band, a wet paper strength enhancer, a coloring dye, a coloring pigment, a fluorescent brightener, a pitch control agent, a thickener, a preservative, and a pH adjuster as necessary.

The material for the support layer 20 is not particularly limited as long as it can support the applied layer 10. The support layer 20 may be a resin film such as a polyethylene terephthalate (PET) film, nonwoven fabric, or synthetic paper produced using a synthetic resin as a main raw material.

1.1.3. Adhesive Layer

The adhesive layer 30 is provided on the releasable layer 40. The adhesive layer 30 has adhesiveness. The material for the adhesive layer 30 is not particularly limited as long as it has adhesiveness, and is, for example, a natural rubber-based resin, a synthetic rubber-based resin, a urethane-based resin, an acrylic resin, a vinyl acetate-based resin, a vinyl acetate-acrylic acid ester copolymer resin, a vinyl acetate-ethylene copolymer resin, or the like.

1.1.4. Releasable Layer

The releasable layer 40 is provided so as to be releasable from the adhesive layer 30. To attach the electromagnetic wave noise suppression sheet 100 to an external device such as an electronic device, the electromagnetic wave noise suppression sheet 100 is attached to the external device by releasing the releasable layer 40 from the adhesive layer 30 and then bringing the adhesive layer 30 into contact with the external device.

The material for the releasable layer 40 is not particularly limited as long as it can be released from the adhesive layer 30, and examples thereof include non-applied paper such as high-quality paper, applied paper such as general coating paper and art paper, a film using glassine paper, polyethylene, polyethylene terephthalate, or the like, and film-laminated paper. If necessary, a silicone resin, a fluororesin, or the like having a dry mass of about 0.1 g/m² to 3 g/m² may be applied as a release agent and dried.

1.2. Modification Examples

Figure 2:
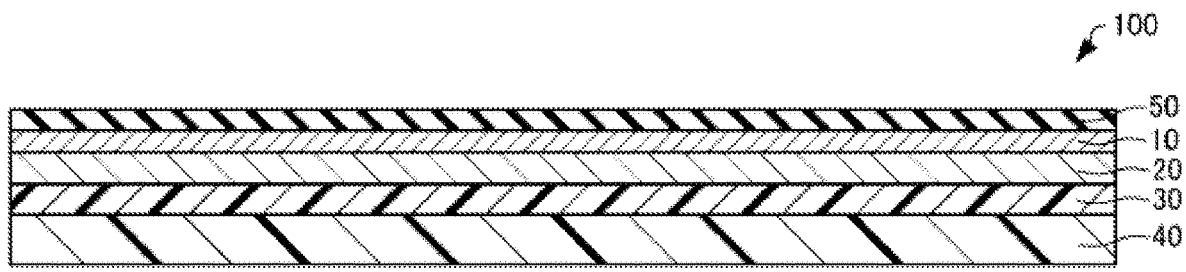
FIG. 2 is a cross-sectional view schematically illustrating an electromagnetic wave noise suppression sheet according to the present embodiment.

As illustrated in FIG. 2, the electromagnetic wave noise suppression sheet 100 may include an overcoat layer 50. The overcoat layer 50 is provided on the applied layer 10. The overcoat layer 50 is an insulating layer that suppresses scratches on the applied layer 10 and imparts dielectric breakdown strength.

The material for the overcoat layer 50 is not particularly limited, and examples thereof include polyethylene terephthalate, polypropylene, a vinyl chloride resin, a fluororesin, a silicone resin, a styrene-acrylic resin, an acrylic resin, a urethane-based resin, an epoxy-based resin, polyethylene wax, polycarbonate, polyphenylene oxide, polysulfone, polyimide, thermoplastic polyester, a phenol resin, a urea resin, an epoxy resin, a melamine resin, a diallyl phthalate resin, a furan resin, and a silicon-based inorganic compound. The overcoat layer 50 may contain only one of these kinds, or may contain two or more thereof at an arbitrary ratio. The overcoat layer 50 preferably has heat resistance.

The thickness of the overcoat layer 50 is not particularly limited, but is, for example, 1 μm or more and 20 μm or less, and preferably 2 μm or more and 10 μm or less. In a case where the thickness of the overcoat layer 50 is 1 μm or more, scratches on the applied layer 10 can be suppressed, and electric insulation properties and dielectric breakdown strength can be imparted. In a case where the thickness of the overcoat layer 50 is 20 μm or less, cost reduction can be achieved.

Figure 3:
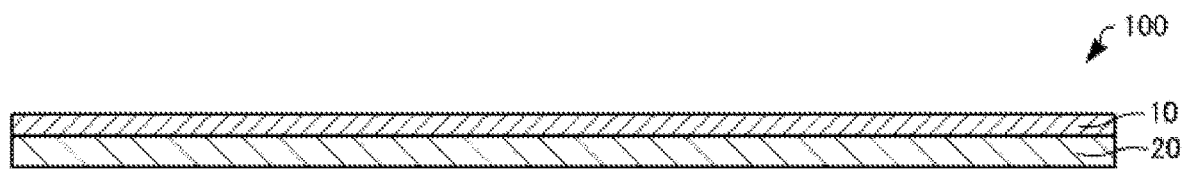
FIG. 3 is a cross-sectional view schematically illustrating an electromagnetic wave noise suppression sheet according to the present embodiment.

Note that, as illustrated in FIG. 3, the electromagnetic wave noise suppression sheet 100 does not need to include the adhesive layer 30 and the releasable layer 40 as long as it includes the applied layer 10 and the support layer 20. The electromagnetic wave noise suppression sheet 100 may include only the applied layer 10 and the support layer 20.

1.3. Electromagnetic Wave Noise Suppression Performance

The electromagnetic wave noise suppression sheet 100 has electromagnetic wave noise suppression performance for suppressing electromagnetic wave noise. The electromagnetic wave noise suppression performance is evaluated by measuring a transmission attenuation power ratio Rtp [dB] by means of a microstrip line method. The larger Rtp is, the higher the electromagnetic wave noise suppression performance is.

2. METHOD FOR MANUFACTURING ELECTROMAGNETIC WAVE NOISE SUPPRESSION SHEET

2.1. Overall Configuration

Figure 4:
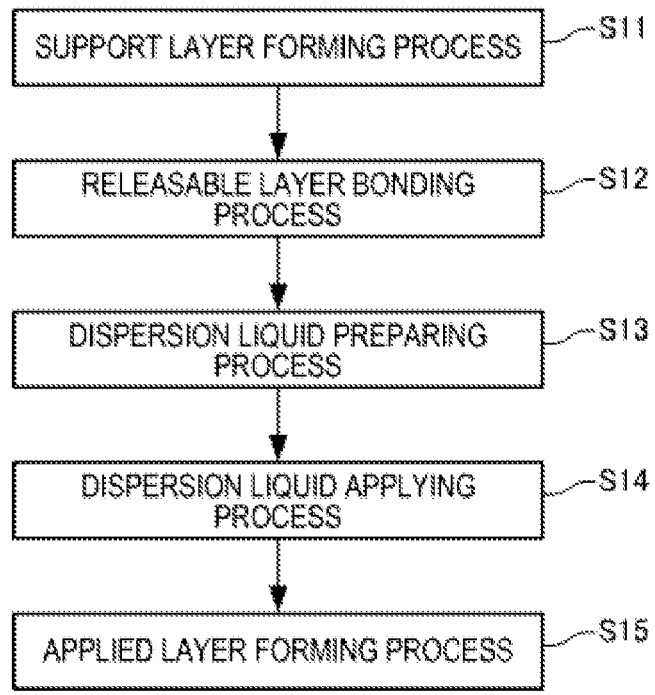
FIG. 4 is a flowchart for explaining a method for manufacturing an electromagnetic wave noise suppression sheet according to the present embodiment.

Next, a method for manufacturing the electromagnetic wave noise suppression sheet 100 according to the present embodiment will be described with reference to the drawings. FIG. 4 is a flowchart for explaining a method for manufacturing the electromagnetic wave noise suppression sheet 100 according to the present embodiment.

The method for manufacturing the electromagnetic wave noise suppression sheet 100 includes, for example, as illustrated in FIG. 4, a support layer forming process (step S11) of forming the support layer 20, a releasable layer bonding process (step S12) of bonding the releasable layer 40 to the support layer 20, a dispersion liquid preparing process (step S13) of preparing a dispersion liquid containing CNTs, CMC, and water, a dispersion liquid applying process (step S14) of applying the dispersion liquid to the support layer 20, and an applied layer forming process (step S15) of drying the dispersion liquid to form the applied layer 10. Hereinbelow, the respective processes will be described in order.

2.2. Support Layer Forming Process (Step S11)

In the support layer forming process, for example, a slurry containing pulp and not containing CNTs is made into paper by a paper machine to form the support layer 20. The Canadian Standard freeness (CSF) value of the slurry for forming the support layer 20 is, for example, 200 ml or more and 550 ml or less, and preferably 250 ml or more and 500 ml or less. The CSF value is derived by the method described in "JIS P 8121-2". The method for papermaking the support layer 20 is not particularly limited, and for example, various machines such as a Fourdrinier paper machine, a multi-wire Fourdrinier paper machine, a cylinder paper machine, a multi-cylinder paper machine, a multi-wire multi-cylinder combined paper machine, and a twin-wire paper machine are used. The papermaking method may be acidic papermaking or neutral papermaking.

A sizing liquid containing a water-soluble polymer such as starch, polyvinyl alcohol, and polyacrylamide may be applied to the surface of the support layer 20. By applying the sizing liquid, it is possible to suppress excessive permeation of the dispersion liquid into the support layer 20 when the dispersion liquid is applied to the support layer 20. Furthermore, the strength of the surface of the support layer 20 can be improved. The sizing liquid contains, for example, a surface sizing agent such as a styrene sizing agent, a styrene-acrylate sizing agent, an olefin sizing agent, an alkyl ketene dimer sizing agent, and an alkenyl succinic anhydride sizing agent. Further, the sizing liquid may contain an auxiliary agent such as a coloring pigment, a coloring dye, a fluorescent dye, and an antifoaming agent. Examples of the method for applying the sizing liquid include a size press, a gate roll coater, a metering sizer, a rod coater, and a bar coater.

In addition, a coating material containing a pigment and an adhesive may be applied to the surface of the support layer 20. By applying the coating material, it is possible to suppress excessive permeation of the dispersion liquid into the support layer 20 when the dispersion liquid is applied to the support layer 20. Examples of the pigment used in the coating material include inorganic pigments such as kaolin, light calcium carbonate, titanium oxide, and plastic pigment, and organic pigments such as plastic pigment. Examples of the adhesive used in the coating material include various copolymer latexes such as a styrene-butadiene-based latex, a styrene-acrylic latex, a vinyl acetate-acrylic latex, and a butadiene-methyl methacrylic latex. Further, the coating material may contain an auxiliary agent such as a pH adjuster, an antifoaming agent, a dispersant, a lubricant, a printability improver, a thickener, a humectant, a fluorescent dye, a coloring pigment, and a coloring dye.

2.3. Releasable Layer Bonding Process (Step S12)

In the releasable layer bonding process, the releasable layer 40 coated with the adhesive layer 30 and dried is bonded to one surface of the support layer 20. The releasable layer 40 and the support layer 20 are bonded via the adhesive layer 30.

2.4. Dispersion Liquid Preparing Process (Step S13)

2.4.1. Preparation of Mixed Liquid

In the dispersion liquid preparing process, first, CNTs, CMC, and water are mixed to prepare a mixed liquid. The CNTs, CMC, and water are mixed by, for example, a homogenizer. In the preparation of the mixed liquid, water is used as a solvent. Examples of the water include pure water such as ion-exchanged water, ultrafiltrated water, reverse osmosis water, and distilled water, and water, such as ultrapure water, obtained by removing as many ionic impurities as possible. By using water as a solvent, it is possible to prepare an environmentally friendly mixed liquid as compared with the case of using an organic solvent as a solvent.

2.4.2. Dispersion by Means of Aqueous Counter Collision Method

Subsequently, CNTs contained in the prepared mixed liquid are dispersed by an aqueous counter collision method to prepare a dispersion liquid. In the process of preparing a dispersion liquid, for example, only CMC is used as a dispersant. By dispersing the CNTs contained in the mixed liquid by means of the aqueous counter collision method, the CNTs can be dispersed with good dispersibility even in a case where the mixed liquid contains only the CMC as a dispersant. This makes it possible to prepare a dispersion liquid having good dispersibility of the CNTs.

In the aqueous counter collision method, the mixed liquid containing the CNTs is discharged from a pair of nozzle holes (a first nozzle hole and a second nozzle hole) disposed to be opposed to each other at high pressure, and the mixed liquid discharged from the first nozzle hole and the mixed liquid discharged from the second nozzle hole are caused to collide with each other to disperse the CNTs. Preferably, in the aqueous counter collision method, the CNTs contained in the mixed liquid discharged from the first nozzle hole and the CNTs contained in the mixed liquid discharged from the second nozzle hole are caused to collide with each other to disperse the CNTs. In the aqueous counter collision method, as long as the central axis of the first nozzle hole and the central axis of the second nozzle hole intersect with each other, the central axes may be colinear or may be inclined with respect to each other. Alternatively, the mixed liquid may be brought into collision with a ceramic ball or the like from the nozzle holes.

In the aqueous counter collision method, for example, the mixed liquids are discharged from the nozzle holes each having a diameter of 50 μm or more and 200 μm or less, preferably 80 μm or more and 120 μm or less, and more preferably 100 μm, and the mixed liquids are caused to collide with each other. In a case where the diameter of the nozzle hole is 50 μm or more, even a mixed liquid having a high viscosity can be discharged from the nozzle hole. In a case where the diameter of the nozzle hole is 200 μm or less, the collision energy between the mixed liquids can be increased.

In the aqueous counter collision method, for example, the mixed liquids are discharged at a pressure of 150 MPa or more and 250 MPa or less, preferably 180 MPa or more and 220 MPa or less, and more preferably 200 MPa, and the mixed liquids are caused to collide with each other. In a case where the pressure is 150 MPa or more, the collision energy between the mixed liquids can be increased. In a case where the pressure is 250 MPa or less, this can make it unlikely that the collision energy is too high to break the CNT fibers, and the viscosity of the dispersion liquid is lowered.

Specifically, the aqueous counter collision method is performed using a wet pulverization and dispersion device "Star Burst Labo" (model name: HJP-25005) manufactured by Sugino Machine Limited. The wet pulverization and dispersion device has higher energy density than, for example, an ultrasonic homogenizer or a ball mill, and can prepare a dispersion liquid having good dispersibility in a short time. Furthermore, the wet pulverization and dispersion device can minimize contamination with impurities, and can produce a dispersion liquid with extremely little contamination with impurities.

The number of times of pass of the mixed liquid in the wet pulverization and dispersion device is, for example, one time or more and 40 times or less, preferably one time or more and 10 times or less, and more preferably one time. In a case where the number of times of pass is 40 times or less, this can make it unlikely that the CNT fibers are broken due to the collision between the mixed liquids, and the viscosity of the dispersion liquid is lowered. In a case where the number of times of pass is one or more, the CNTs can be dispersed uniformly. Furthermore, in a case where the number of times of pass is one or more, no significant difference is confirmed in the dispersibility of the CNTs. Therefore, in a case where the number of times of pass is one, it is possible to shorten the treatment time of the wet pulverization and dispersion device while maintaining good dispersibility.

Here, "the number of times of pass of the mixed liquid in the wet pulverization and dispersion device" refers to the number of times of circulation of the mixed liquid in the wet pulverization and dispersion device, and for example, "the number of times of pass is two" means that the mixed liquid is circulated twice such that CNTs colliding once collide with each other again. In this manner, the number of times of pass corresponds to the number of times of collision of the CNTs contained in the mixed liquid. Furthermore, the number of times of pass is proportional to the treatment time in the wet pulverization and dispersion device. In a case where the treatment time in the wet pulverization and dispersion device is long, the number of times of circulation of the mixed liquid increases.

Note that the device used in the aqueous counter collision method is not limited to the wet pulverization and dispersion device "Star Burst Labo" as long as it is possible to prepare a dispersion liquid having good dispersibility and to produce an electromagnetic wave noise suppression sheet having high electromagnetic wave noise suppression performance and high thermal conductivity. In addition, the aqueous counter collision method is not required to be used as long as it is possible to prepare a dispersion liquid having good dispersibility and to produce an electromagnetic wave noise suppression sheet having high electromagnetic wave noise suppression performance and high thermal conductivity.

In addition, it is preferable to treat the mixed liquid with a homogenizer as a pretreatment before dispersing the CNTs by means of the aqueous counter collision method. The homogenizer may be an ultrasonic type that generates cavitation using ultrasonic waves, a stirring type that stirs the mixed liquid, or a pressure type that applies pressure to the mixed liquid. By the treatment with the homogenizer, the aggregates of the CNTs can be reduced, and dispersion can be performed smoothly.

2.4.3. Mixing of Inorganic Filler

Subsequently, an inorganic filler is mixed with the prepared dispersion liquid to prepare a dispersion liquid containing CNTs, an inorganic pigment, CMC, and water.

The method for mixing the inorganic pigment is not particularly limited, but is performed using, for example, a homogenizer.

In the dispersion liquid, the ratio $M_F/M_{CNT}$ of the mass $M_F$ of the inorganic filler to the mass $M_{CNT}$ of the CNTs is the same as the ratio $M_F/M_{CNT}$ in the applied layer 10 described above. Similarly, in the dispersion liquid, the ratio $M_{CMC}/M_{SUM}$ of the mass $M_{CMC}$ of the CMC to the sum $M_{SUM}$ of the mass of the CNTs and the mass of the inorganic filler is the same as the ratio $M_{CMC}/M_{SUM}$ in the applied layer 10 described above.

By mixing the inorganic filler, the concentration and viscosity of the dispersion liquid can be increased. In a case where it is desired to further increase the viscosity of the dispersion liquid, a thickener may be mixed with the dispersion liquid. Examples of the thickener include celluloses such as methyl cellulose and hydroxypropyl cellulose, and ammonium salts or alkali metal salts thereof; polycarboxylic acids such as poly (meth) acrylic acid and modified poly (meth) acrylic acid, and alkali metal salts thereof; a polyvinyl alcohol-based (co) polymer such as polyvinyl alcohol, modified polyvinyl alcohol, and an ethylene-vinyl alcohol copolymer; a saponified product of a copolymer of unsaturated carboxylic acid such as (meth) acrylic acid, maleic acid, and fumaric acid with vinyl ester; and a water-soluble polymer such as a polyacrylamide-based copolymer.

The viscosity of the dispersion liquid in which the inorganic filler is mixed is not particularly limited, but is preferably 100 mPa·s or more and 4000 mPa·s or less at 20° C. In a case where the viscosity of the dispersion liquid is 100 mPa·s or more, it is easy to apply the dispersion liquid to the support layer 20 using a roller as described above. In a case where the viscosity of the dispersion liquid is 4000 mPa·s or less, stagnation in the dispersion liquid applying process is suppressed, contamination is hardly caused, and the dispersion liquid is easily applied. The viscosity of the dispersion liquid can be measured by a viscometer.

In the above description, an example has been described in which CNTs, CMC, and water are mixed to prepare a mixed liquid, the CNTs contained in the mixed liquid are dispersed by the aqueous counter collision method, and then an inorganic filler is mixed, but the dispersion liquid preparing process is not limited to this example. For example, CNTs, an inorganic pigment, CMC, and water may be mixed to prepare a mixed liquid, and the mixed liquid may be subjected to the aqueous counter collision method to disperse the CNTs. Alternatively, for example, a powder of an inorganic pigment and a powder of CMC may be added to a CNT-containing liquid subjected to the aqueous counter collision method and mixed to prepare a dispersion liquid in which CNTs are dispersed.

Also, the order of the dispersion liquid preparing process and the support layer forming process is not particularly limited, and the support layer forming process may be performed after the dispersion liquid preparing process, or the dispersion liquid preparing process may be performed after the support layer forming process. Similarly, the order of the dispersion liquid preparing process and the releasable layer bonding process is not particularly limited.

2.5. Dispersion Liquid Applying Process (Step S14)

In the dispersion liquid applying process, the dispersion liquid prepared in the dispersion liquid preparing process is applied to the surface of the support layer 20 opposite to the releasable layer 40. The method for applying the dispersion liquid is not particularly limited, and examples thereof include a method for applying the dispersion liquid to the support layer 20 using a die coater, a gravure coater, a wire bar coater, a knife coater, an air coater, a blade coater, a roll coater, a reverse roll coater, or the like.

2.6. Applied Layer Forming Process (Step S15)

In the applied layer forming process, the dispersion liquid applied to the support layer 20 is dried to form the applied layer 10. The method for drying the dispersion liquid is not particularly limited as long as moisture contained in the dispersion liquid can be evaporated, and examples thereof include hot air drying, infrared drying, and natural drying.

In a case where the thickness of the support layer 20 is short, wrinkles may occur in the support layer 20 when the dispersion liquid is dried, but as illustrated in FIG. 4, the strength of the support layer 20 can be increased by bonding the releasable layer 40 to the support layer 20 before the dispersion liquid is applied to the support layer 20. This can reduce the possibility of generation of wrinkles in the support layer 20.

Through the above processes, the electromagnetic wave noise suppression sheet 100 can be manufactured.

Note that, to form the overcoat layer 50 as illustrated in FIG. 2, for example, an overcoat liquid to be the overcoat layer 50 is applied to the applied layer 10 by any of the methods listed as a method for applying a dispersion liquid containing CNTs to the support layer 20, and is then subjected to hot air drying, infrared drying, or natural drying.

The material used for the overcoat liquid is not particularly limited, and examples thereof include polyethylene terephthalate, polypropylene, a vinyl chloride resin, a fluororesin, a silicone resin, a styrene-acrylic resin, an acrylic resin, a urethane-based resin, an epoxy-based resin, polyethylene wax, polycarbonate, polyphenylene oxide, polysulfone, polyimide, thermoplastic polyester, a phenol resin, a urea resin, an epoxy resin, a melamine resin, a diallyl phthalate resin, a furan resin, and a silicon-based inorganic compound. The overcoat liquid may contain only one of these kinds, or may contain two or more thereof at an arbitrary ratio.

2.7. Modification Examples

Figure 5:
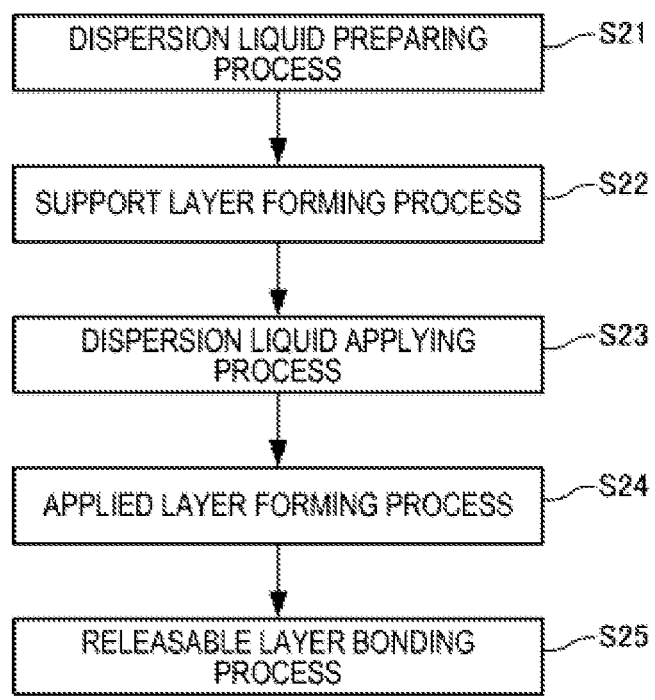
FIG. 5 is a flowchart for explaining a method for manufacturing an electromagnetic wave noise suppression sheet according to the present embodiment.

FIG. 5 is a flowchart for explaining a method for manufacturing the electromagnetic wave noise suppression sheet 100 according to the present embodiment.

In the example illustrated in FIG. 4 described above, the releasable layer bonding process (step S12) is performed before the dispersion liquid applying process (step S14).

On the other hand, in the example illustrated in FIG. 5, a releasable layer bonding process (step S25) is performed after a dispersion liquid applying process (step S23). In a case where the strength of the support layer 20 is high, as in the case where the thickness of the support layer 20 is long, the possibility of generation of wrinkles in the support layer 20 at the time of drying the dispersion liquid can be reduced even if the releasable layer bonding process (step S25) is performed after the dispersion liquid applying process (step S23).

In the example illustrated in FIG. 5, the method for manufacturing the electromagnetic wave noise suppression sheet 100 includes a dispersion liquid preparing process (step S21) of preparing a dispersion liquid containing CNTs, CMC, and water, a support layer forming process (step S22) of forming the support layer 20, a dispersion liquid applying process (step S23) of applying the dispersion liquid to the support layer 20, an applied layer forming process (step S24)

of drying the dispersion liquid to form the applied layer 10, and a releasable layer bonding process (step S25) of bonding the releasable layer 40 to the support layer 20.

The dispersion liquid preparing process (step S21) is basically the same as the dispersion liquid preparing process (step S13) described above. The support layer forming process (step S22) is basically the same as the support layer forming process (step S11) described above. The dispersion liquid applying process (step S23) is basically the same as the dispersion liquid applying process (step S14) described above. The applied layer forming process (step S24) is basically the same as the applied layer forming process (step S15) described above. The releasable layer bonding process (step S25) is basically the same as the releasable layer bonding process (step S12) described above.

3. EXPERIMENTAL EXAMPLES

Hereinbelow, the present invention will be described more specifically with reference to experimental examples. Note that the present invention is not limited at all by the following experimental examples.

3.1. First Experimental Example

3.1.1. Preparation of Electromagnetic Wave Noise Suppression Sheet

CNTs, CMC, and water were mixed to prepare a mixed liquid. For mixing, a homogenizer "Bio Mixer BM-2" manufactured by Nihonseiki Kaisha Ltd. was used. The mixing treatment time was set to 5 minutes.

As the CNTs, "K-Nanos-100P" manufactured by KUMHO PETROCHEMICAL was used. The CNT is an MWCNT, has a diameter of 8 nm to 15 nm, a fiber length of 27 μm (bundled), and a BET specific surface area of 220 $m^2/g$.

As the CMC, "CELLOGEN 5A" manufactured by DKS Co. Ltd. was used. The CMC has a weight average molecular weight of 11000 to 15000 and a degree of etherification of 0.7. As the dispersant, only CMC was used. Additives such as a thickener were not added.

Subsequently, the mixed liquid was subjected to an aqueous counter collision method. The aqueous counter collision method was performed using a wet pulverization and dispersion device "Star Burst Labo" (model name: HJP-25005) manufactured by Sugino Machine Limited. The diameter of the nozzle hole through which the mixed liquid would be discharged was set to 100 and the discharge pressure of the mixed liquid was set to 200 MPa. The number of times of pass of the mixed liquid in the wet pulverization and dispersion device was two. In this manner, a dispersion liquid containing CNTs, CMC, and water was prepared.

Subsequently, carbon black or graphite as an inorganic filler was added to and mixed with the dispersion liquid to prepare a dispersion liquid containing the inorganic filler. In this manner, a dispersion liquid containing CNTs, an inorganic filler, CMC, and water was prepared. For mixing, a homogenizer "Bio Mixer BM-2" manufactured by Nihonseiki Kaisha Ltd. was used. The mixing treatment time was set to 5 minutes.

As the carbon black, "Asahi Thermal" and "SB 720" manufactured by Asahi Carbon Co., Ltd. were used. As the graphite, a scale-like graphite powder "J-CPB" manufactured by Nippon Graphite Industries Co., Ltd. was used.

As for the dispersion liquid, the ratio $M_F/M_{CNT}$ of the mass $M_F$ of the inorganic filler to the total $M_{SUM}$ of the mass $M_{CNT}$ of the CNTs and the mass $M_F$ of the inorganic filler was varied in a range of ¼ to 4 (CNT:inorganic filler=4:1 to 1:4).

Also, the dispersion liquid was prepared so that the ratio $M_{CMC}/M_{SUM}$ of the mass $M_{CMC}$ of the CMC to the sum $M_{SUM}$ of the mass of the CNTs and the mass of the inorganic filler was 1 ((CNT+inorganic filler):CMC=1:1). Further, the dispersion liquid was prepared so that the total of the content of the CNTs, the content of the inorganic pigment, and the content of the CMC was 5 mass %.

The dispersion liquid was applied to the support layer ("Hamayu" (registered trademark) manufactured by Hokuetsu Corporation, basis weight: 30 $g/m^2$) by a die coater, and then dried at 60° C. to 70° C. to evaporate moisture, thereby preparing applied paper including the support layer and the applied layer.

As described above, applied paper as an electromagnetic wave noise suppression sheet was prepared.

3.1.2. Evaluation Method

The electromagnetic wave noise suppression performance of the applied paper was evaluated. The electromagnetic wave noise suppression performance was evaluated by measuring a transmission attenuation power ratio Rtp [dB] by means of a microstrip line method. As a measuring instrument, one obtained by connecting a test fixture "TF-18C" manufactured by KEYCOM to a network analyzer "ZVA67" manufactured by ROHDE & SCHWARZ was used. The measurement was performed in accordance with "IEC 62333". The measurement frequency was from 500 MHz to 18 GHz.

Further, the thickness of the applied layer of the applied paper was measured by SEM.

Further, the surface resistivity of the applied layer of the applied paper was measured. As a measuring instrument, "Loresta-AX MCP-T370" manufactured by Mitsubishi Chemical Analytech Co., Ltd. was used. The measurement was performed in accordance with "JIS K 7194".

Further, the thermal conductivity in the in-plane direction was measured on the basis of the above formula (1). The thermal conductivity was measured on a dry film because it was necessary to thicken the layer containing CNTs to measure it. The dry film was prepared by placing the dispersion liquid containing CNTs, an inorganic filler, CMC, and water in a petri dish having a diameter of 8.5 cm, and drying the dispersion liquid at 50° C. for 12 hours to evaporate moisture. The thermal diffusivity was measured by a laser flash method using "LFA 567 HyperFlash" manufactured by NETZSCH. The specific heat was measured using "Discovery DSC 25" manufactured by TA Instruments. The density was calculated from the volume and weight of the dry film.

3.1.3. Evaluation Results

Figure 7:
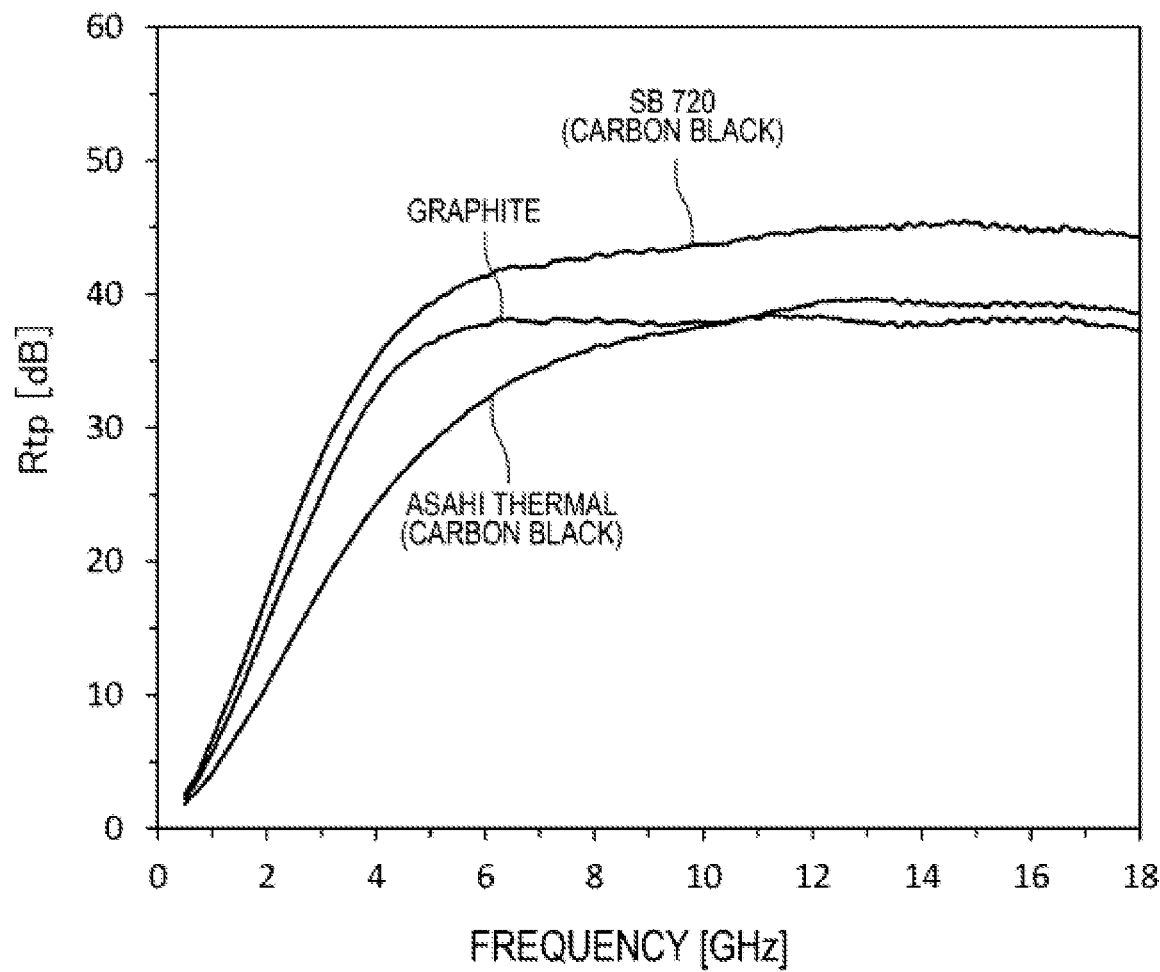
FIG. 7 is a graph illustrating a transmission attenuation power ratio of applied paper with respect to frequency in a case of carbon nanotube:inorganic filler=4:1.
Figure 8:
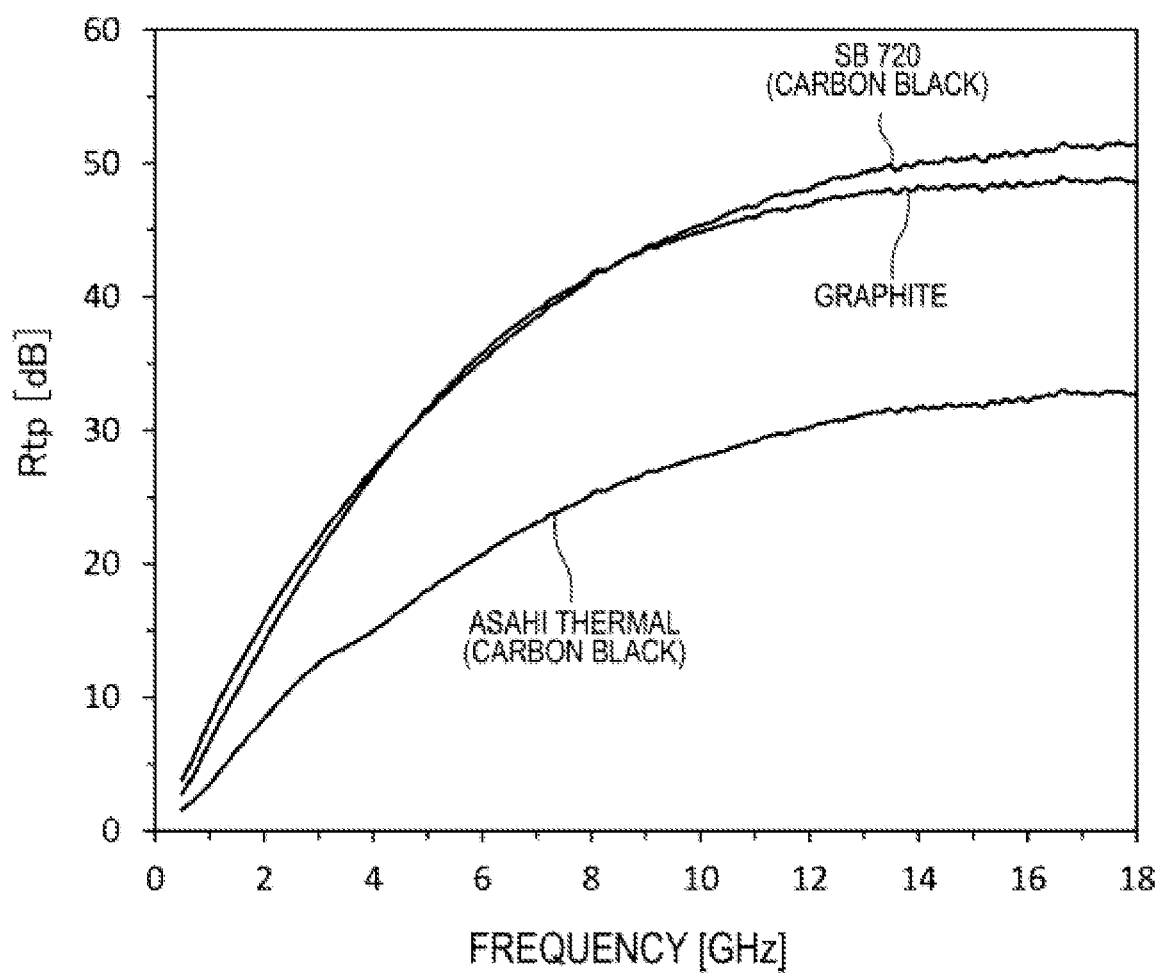
FIG. 8 is a graph illustrating a transmission attenuation power ratio of applied paper with respect to frequency in a case of carbon nanotube:inorganic filler=1:1.
Figure 9:
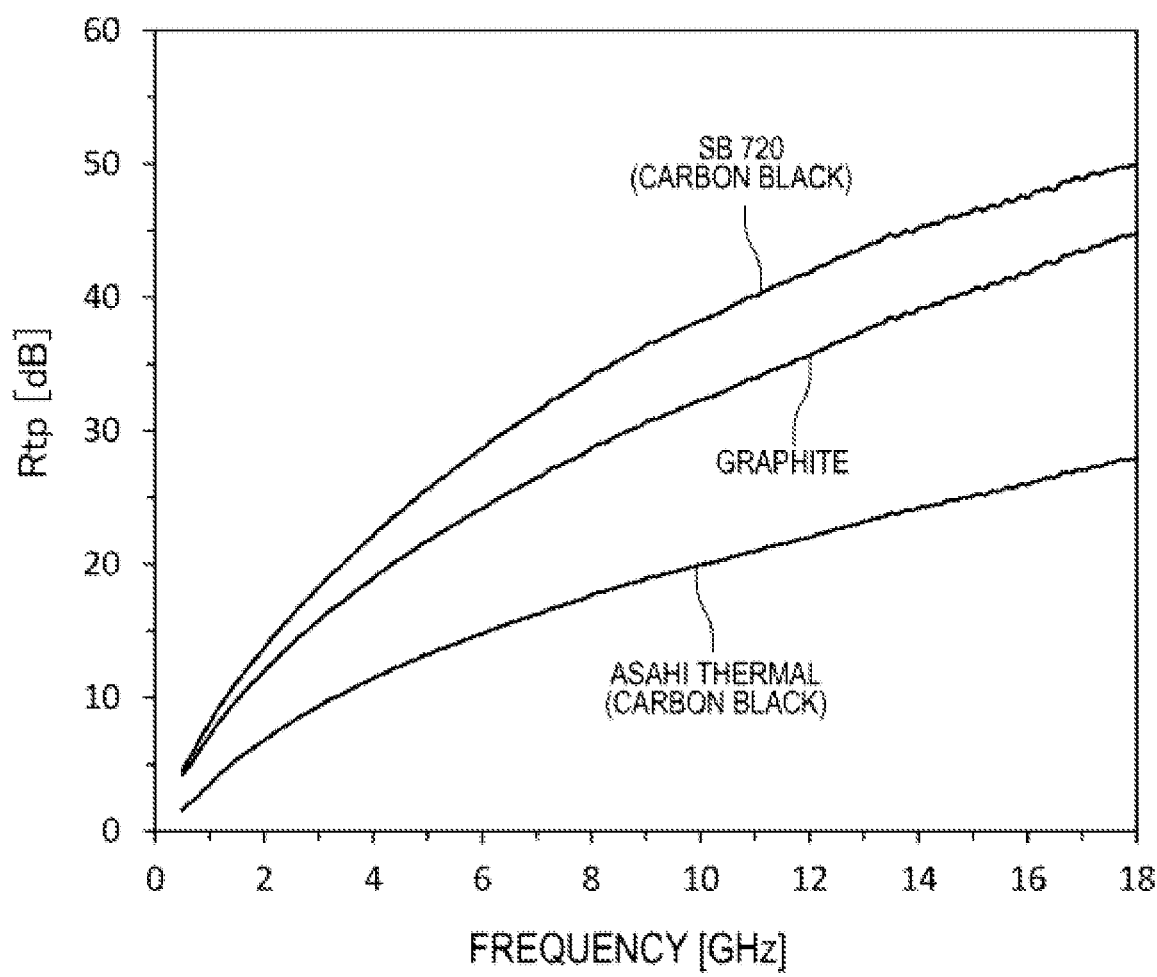
FIG. 9 is a graph illustrating a transmission attenuation power ratio of applied paper with respect to frequency in a case of carbon nanotube:inorganic filler=1:2.
Figure 10:
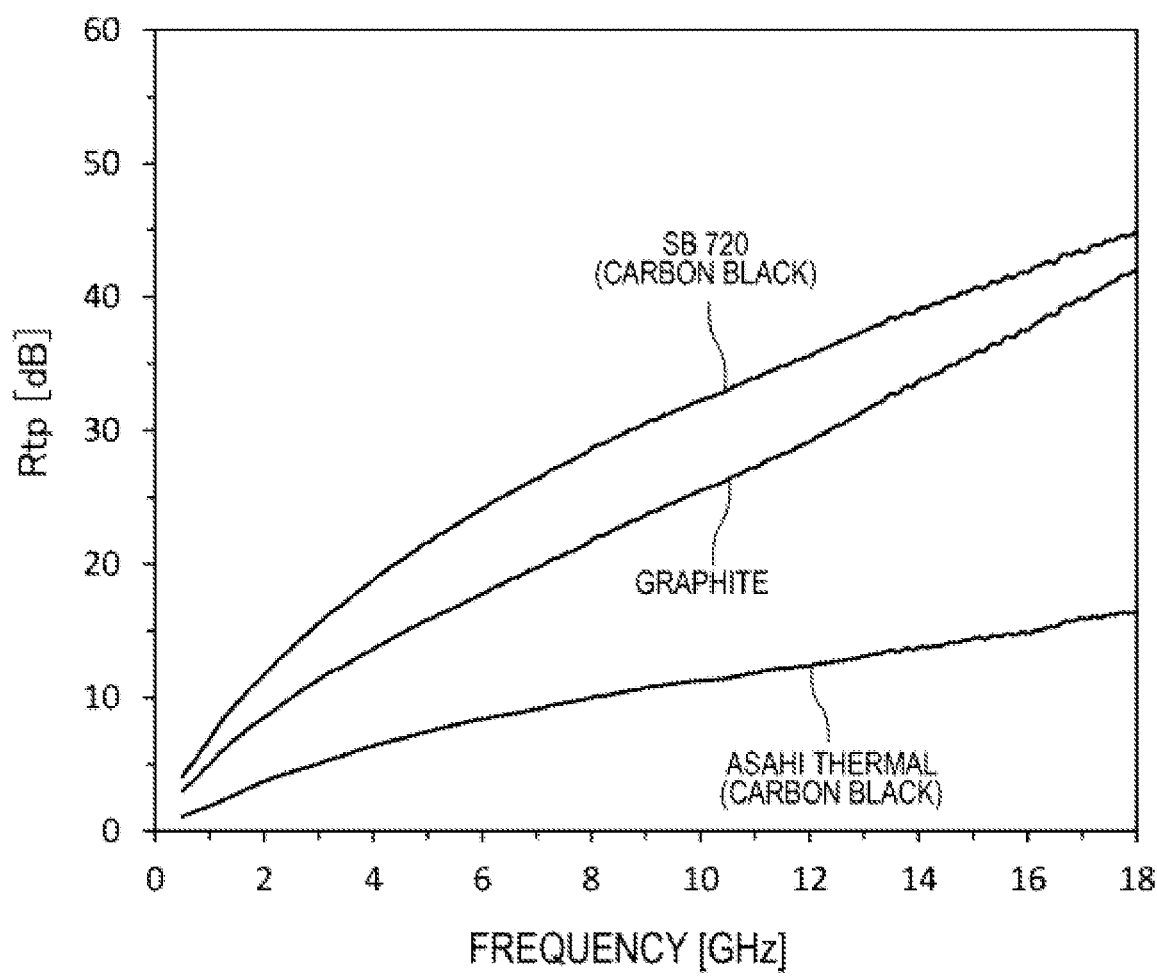
FIG. 10 is a graph illustrating a transmission attenuation power ratio of applied paper with respect to frequency in a case of carbon nanotube:inorganic filler=1:4.

FIG. 6 is a table illustrating Rtp of applied paper in which the mass ratio between CNTs and each inorganic filler is varied. FIG. 6 further illustrates the thickness of the applied layer, the surface resistivity of the applied layer, and the thermal conductivity of the dry film. FIGS. 7 to 10 are graphs illustrating Rtp of applied paper with respect to frequency. FIG. 7 is a graph in a case of CNT:inorganic filler=4:1. FIG. 8 is a graph in a case of CNT:inorganic filler=1:1. FIG. 9 is a graph in a case of CNT:inorganic filler=1:2. FIG. 10 is a graph in a case of CNT:inorganic filler=1:4. The Rtp values illustrated in FIG. 6 are obtained by reading the values at 6 GHz and 15 GHz from the graphs illustrated in FIGS. 7 to 10.

As illustrated in FIGS. 6 to 10, regardless of the kind of the inorganic filler, the applied paper with CNT:inorganic filler=4:1 to 1:2 had a higher Rtp value than the applied paper with CNT:inorganic filler=1:4. As illustrated in FIG. 6, all the samples had a thermal conductivity higher than 1.10 and indicated high thermal conductivity. The applied paper with CNT:inorganic filler=1:4 had lower thermal conductivity than the applied paper with CNT:inorganic filler=1:2. It has been found that, in a case of CNT:CMC=4:1 to 1:2, both the electromagnetic wave noise suppression performance and the thermal conductivity can be improved, and the cost can be reduced.

As illustrated in FIG. 6, the dry film using graphite had higher thermal conductivity than the dry film using carbon black. It has been found that graphite is a more suitable inorganic filler for achieving both electromagnetic wave noise suppression performance and thermal conductivity than carbon black.

As illustrated in FIGS. 6 to 9, the applied paper with CNT:graphite=4:1 or 1:1 had higher electromagnetic wave noise suppression performance at a frequency of 12 GHz or less than the applied paper with CNT:graphite=1:2. On the other hand, at a frequency of 14 GHz or more, the applied paper with CNT:graphite=1:1 or 1:2 had higher electromagnetic wave noise suppression performance than the applied paper with CNT:graphite=4:1. As illustrated in FIG. 6, the dry film with CNT:graphite=1:1 or 1:2 had higher thermal conductivity than the dry film with CNT:graphite=4:1.

As illustrated in FIGS. 6 to 10, the applied paper using "SB 720" as the inorganic filler had a higher Rtp than the applied paper using "Asahi Thermal". The iodine adsorption amount of "SB 720" is 138 mg/g, and the iodine adsorption amount of "Asahi Thermal" is 27 mg/g. The DBP absorption amount of "SB 720" is 59 ml/100 g, and the DBP absorption amount of "Asahi Thermal" is 28 ml/100 g. Therefore, it has been found that Rtp tends to be higher in the case of carbon black having a larger iodine adsorption amount and DBP absorption amount.

3.2. Second Experimental Example

In a second experimental example, instead of carbon black or graphite, an inorganic pigment was used as an inorganic filler. A preparation method and an evaluation method are the same as those in the first experimental example except that an inorganic pigment was used.

Kaolin, light calcium carbonate (hereinbelow, also referred to as "light cal"), and heavy calcium carbonate (hereinbelow, also referred to as "heavy cal") were used as inorganic fillers. As the kaolin, "Hydragloss 90" manufactured by Imerys Minerals Japan K. K. was used. As the light cal, "Tama Pearl TP 121" manufactured by Okutama Kogyo Co., Ltd. was used. As the heavy cal, "Softon 1500" manufactured by Bihoku Funka Kogyo Co., Ltd. was used.

Figure 12:
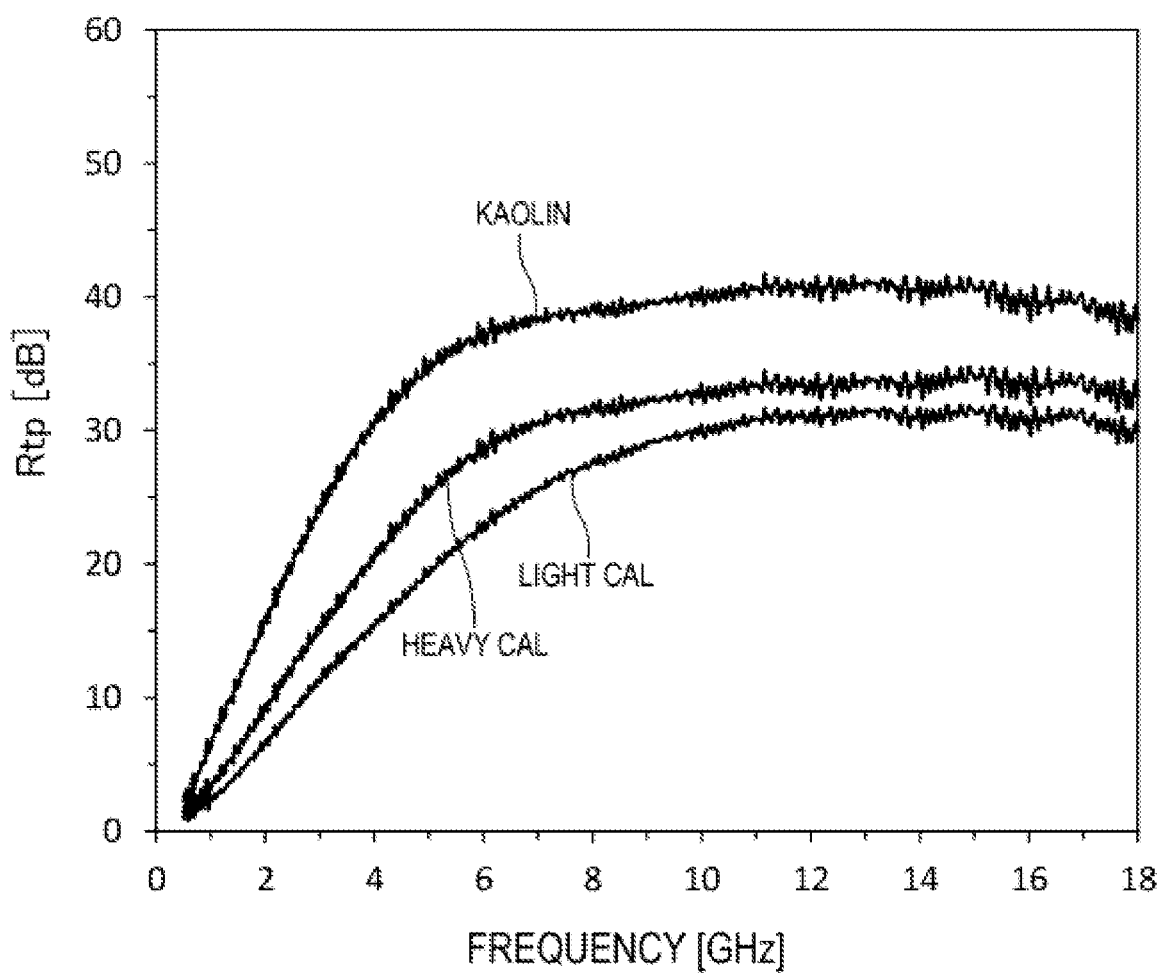
FIG. 12 is a graph illustrating a transmission attenuation power ratio of applied paper with respect to frequency in a case of carbon nanotube:inorganic filler=4:1.
Figure 13:
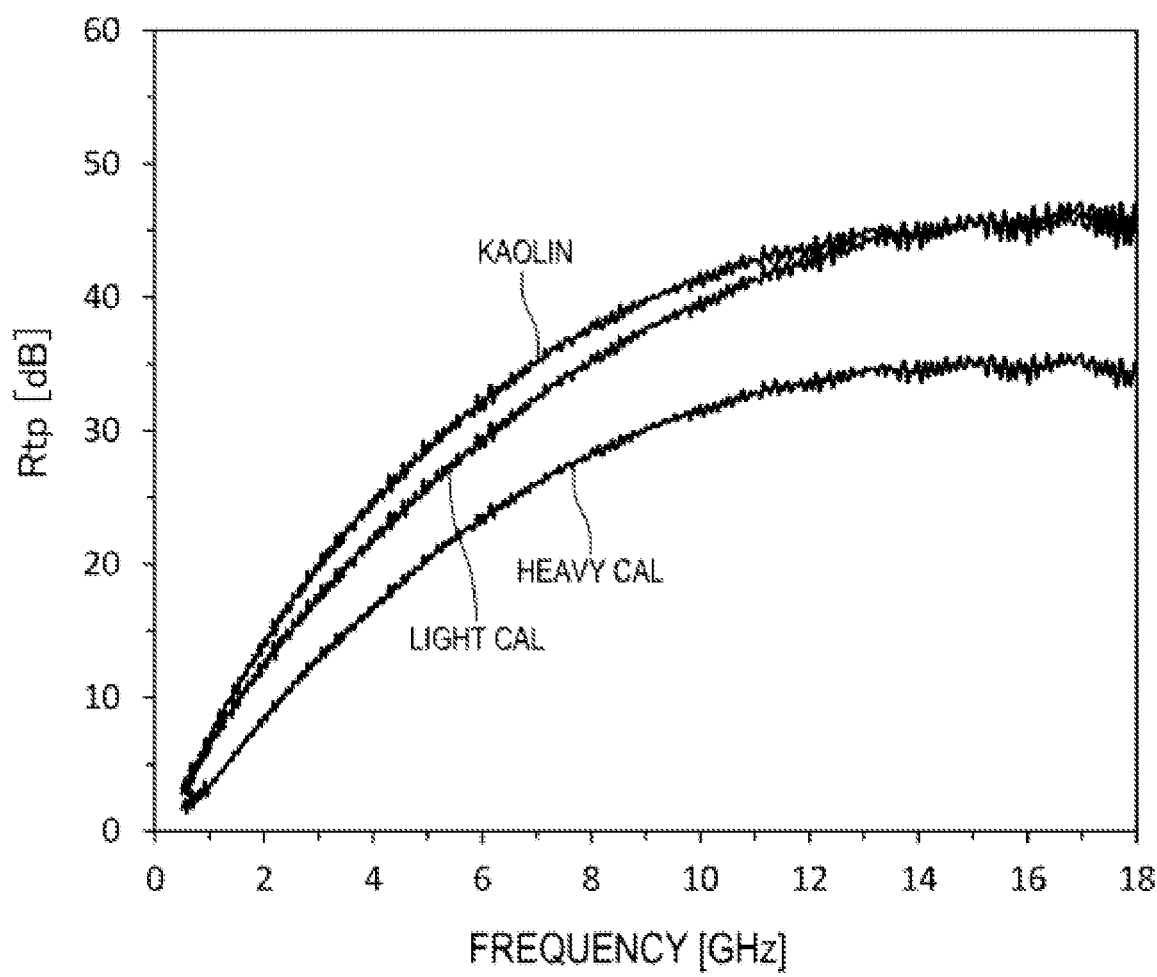
FIG. 13 is a graph illustrating a transmission attenuation power ratio of applied paper with respect to frequency in a case of carbon nanotube:inorganic filler=1:1.
Figure 14:
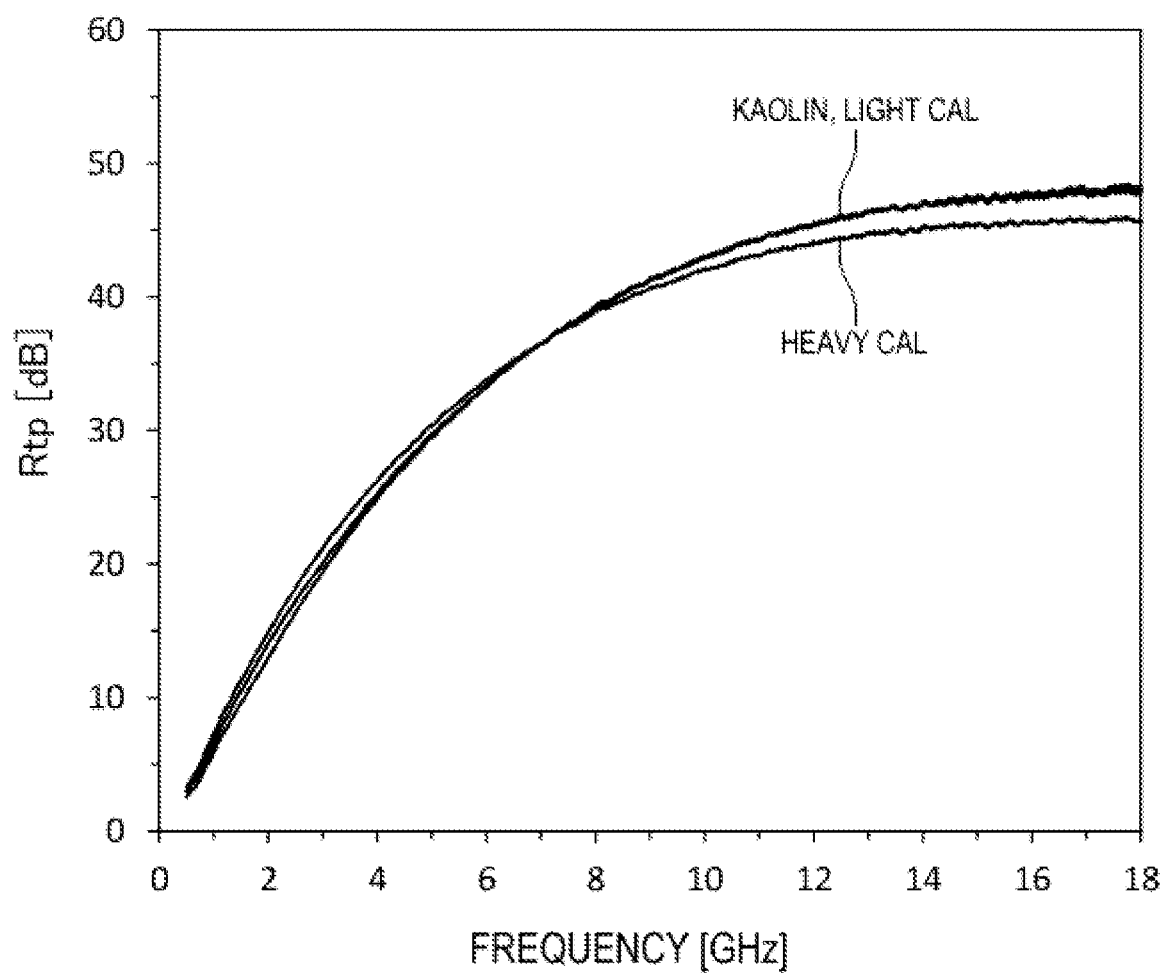
FIG. 14 is a graph illustrating a transmission attenuation power ratio of applied paper with respect to frequency in a case of carbon nanotube:inorganic filler=1:2.
Figure 15:
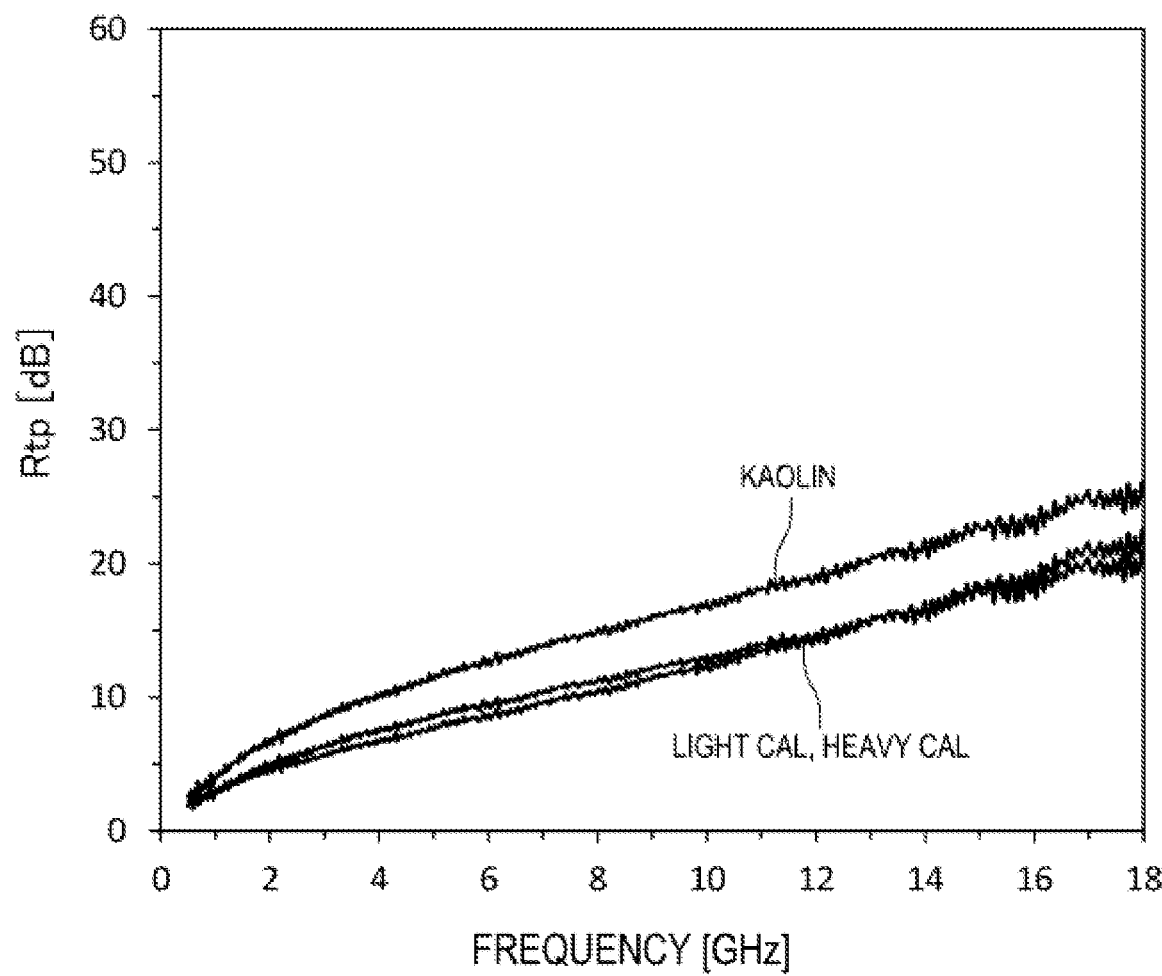
FIG. 15 is a graph illustrating a transmission attenuation power ratio of applied paper with respect to frequency in a case of carbon nanotube:inorganic filler=1:4.

FIG. 11 is a table illustrating Rtp of applied paper in which the mass ratio between CNTs and each inorganic filler is varied. FIG. 11 further illustrates the thickness of the applied layer, the surface resistivity of the applied layer, and the thermal conductivity of the dry film. FIGS. 12 to 15 are graphs illustrating Rtp of applied paper with respect to frequency. FIG. 12 is a graph in a case of CNT:inorganic filler=4:1. FIG. 13 is a graph in a case of CNT:inorganic filler=1:1. FIG. 14 is a graph in a case of CNT:inorganic filler=1:2. FIG. 15 is a graph in a case of CNT:inorganic filler=1:4. The Rtp values illustrated in FIG. 11 are obtained by reading the values at 6 GHz and 15 GHz from the graphs illustrated in FIGS. 12 to 15.

As illustrated in FIGS. 11 to 15, regardless of the kind of the inorganic filler, the applied paper with CNT:inorganic filler=4:1 to 1:2 had a higher Rtp value than the applied paper with CNT:inorganic filler=1:4. As illustrated in FIG. 11, all the samples had a thermal conductivity higher than 1.10 and indicated high thermal conductivity. It has been found that, in a case of CNT:CMC=4:1 to 1:2, both the electromagnetic wave noise suppression performance and the thermal conductivity can be improved, and the cost can be reduced.

As illustrated in FIGS. 6 and 11, the applied paper using an inorganic pigment, which is non-conductive, had almost the same Rtp as that of the applied paper using carbon black or graphite, which is conductive. The thermal conductivity of the dry film using an inorganic pigment was not as high as the thermal conductivity of the dry film using graphite, but was about the same as that of "SB 720", which is carbon black. The reason for this is that an inorganic pigment has lower thermal diffusivity than carbon black but has higher density and specific heat than carbon black.

As illustrated in FIGS. 11 to 15, the applied paper using kaolin tends to have a higher Rtp than the applied paper using light cal or heavy cal. It has been found that kaolin is a more suitable inorganic filler for achieving both electromagnetic wave noise suppression performance and thermal conductivity than light cal and heavy cal. Kaolin has a higher aspect ratio than light cal and heavy cal and easily achieves smoothness. Therefore, in the case of kaolin, the surface resistivity is low, and Rtp is high.

As illustrated in FIGS. 11 to 14, the applied paper with CNT:kaolin=4:1 or 1:1 had higher electromagnetic wave noise suppression performance at a frequency of 7 GHz or less than the applied paper with CNT:kaolin=1:2. On the other hand, at a frequency of 9 GHz or more, the applied paper with CNT:kaolin=1:1 or 1:2 had higher electromagnetic wave noise suppression performance than the applied paper with CNT:kaolin=4:1. As illustrated in FIG. 11, the dry film with CNT:kaolin=1:1 or 1:2 had higher thermal conductivity than the dry film with CNT:kaolin=4:1.

The above-described embodiments and modification examples are illustrative only, and the present invention is not limited thereto. For example, the respective embodiments and respective modification examples can appropriately be combined.

The present invention is not limited to the above-described embodiments, and can be modified in various ways. For example, the present invention includes substantially the same configuration as the configuration described in the embodiment. The substantially same configuration is, for example, a configuration having the same function, method, and result, or a configuration having the same object and effect. In addition, the present invention includes a configuration in which a non-essential part of the configuration described in the embodiment is replaced. In addition, the present invention includes a configuration that achieves the same operation and effect as the configuration described in the embodiment or a configuration that can achieve the same object. In addition, the present invention includes a configuration obtained by adding a known technique to the configuration described in the embodiment.

REFERENCE SIGNS LIST

10 Applied layer
20 Support layer

30 Adhesive layer
40 Releasable layer
50 Overcoat layer
100 Electromagnetic wave noise suppression sheet

The invention claimed is:

1. An electromagnetic wave noise suppression sheet comprising:
a first layer consisting of carbon nanotubes, an inorganic filler, and sodium carboxymethylcellulose, and optionally thickener selected from the group consisting of celluloses and ammonium salts or alkali metal salts thereof, polycarboxylic acids and alkali metal salts thereof, a polyvinyl alcohol-based (co) polymer, a saponified product of a copolymer of unsaturated carboxylic acid with vinyl ester, and a polyacrylamide-based copolymer, wherein
the inorganic filler is at least one selected from the group consisting of graphite, carbon black, and an inorganic pigment, and
a ratio of a mass of the inorganic filler to a mass of the carbon nanotubes is ¼ or more and 2 or less.

2. The electromagnetic wave noise suppression sheet according to claim 1, wherein the inorganic filler is graphite.

3. The electromagnetic wave noise suppression sheet according to claim 1, wherein the inorganic filler is an inorganic pigment.

4. The electromagnetic wave noise suppression sheet according to claim 3, wherein the inorganic pigment is kaolin.

5. The electromagnetic wave noise suppression sheet according to claim 2, wherein the ratio is ¼ or more and 1 or less.

6. The electromagnetic wave noise suppression sheet according to claim 2, wherein the ratio is 1 or more and 2 or less.

7. The electromagnetic wave noise suppression sheet according to claim 1, comprising a second layer provided with the first layer.

8. A method for manufacturing an electromagnetic wave noise suppression sheet comprising:
a process of preparing a dispersion liquid consisting of carbon nanotubes, an inorganic filler, sodium carboxymethylcellulose and water and optionally a thickener selected from the group consisting of celluloses and ammonium salts or alkali metal salts thereof, polycarboxylic acids and alkali metal salts thereof, a polyvinyl alcohol-based (co) polymer, a saponified product of a copolymer of unsaturated carboxylic acid with vinyl ester, and a polyacrylamide-based copolymer; and
a process of forming a first layer by drying the dispersion liquid, wherein
the inorganic filler is at least one selected from the group consisting of graphite, carbon black, and an inorganic pigment, and,
in the dispersion liquid, a ratio of a mass of the inorganic filler to a mass of the carbon nanotubes is ¼ or more and 2 or less.

9. The method for manufacturing an electromagnetic wave noise suppression sheet according to claim 8, wherein the inorganic filler is graphite.

10. The method for manufacturing an electromagnetic wave noise suppression sheet according to claim 8, wherein the inorganic filler is an inorganic pigment.

11. The method for manufacturing an electromagnetic wave noise suppression sheet according to claim 10, wherein the inorganic pigment is kaolin.

12. The method for manufacturing an electromagnetic wave noise suppression sheet according to claim 8, comprising a process of applying the dispersion liquid to a second layer before the process of forming the first layer.

13. The electromagnetic wave noise suppression sheet according to claim 4, wherein the ratio is ¼ or more and 1 or less.

14. The electromagnetic wave noise suppression sheet according to claim 4, wherein the ratio is 1 or more and 2 or less.

15. The electromagnetic wave noise suppression sheet according to claim 2, comprising a second layer provided with the first layer.

16. The electromagnetic wave noise suppression sheet according to claim 3, comprising a second layer provided with the first layer.

17. The electromagnetic wave noise suppression sheet according to claim 4, comprising a second layer provided with the first layer.

18. The method for manufacturing an electromagnetic wave noise suppression sheet according to claim 9, comprising a process of applying the dispersion liquid to a second layer before the process of forming the first layer.

19. The method for manufacturing an electromagnetic wave noise suppression sheet according to claim 10, comprising a process of applying the dispersion liquid to a second layer before the process of forming the first layer.

20. The method for manufacturing an electromagnetic wave noise suppression sheet according to claim 11, comprising a process of applying the dispersion liquid to a second layer before the process of forming the first layer.

* * * * *